(12) United States Patent
Terui

(10) Patent No.: US 7,687,283 B2
(45) Date of Patent: Mar. 30, 2010

(54) METHOD OF PRODUCING A SEMICONDUCTOR DEVICE HAVING A MAGNETIC LAYER FORMED THEREON

(75) Inventor: Makoto Terui, Yamanashi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 435 days.

(21) Appl. No.: 11/159,145

(22) Filed: Jun. 23, 2005

(65) Prior Publication Data

US 2006/0038245 A1 Feb. 23, 2006

(30) Foreign Application Priority Data

Aug. 17, 2004 (JP) ............... 2004-236995

(51) Int. Cl.
*H01L 21/00* (2006.01)
(52) U.S. Cl. ............ 438/3; 438/113; 438/462; 257/E23.179; 257/E21.599
(58) Field of Classification Search ............ 438/22–26, 438/33, 107, 110, 113–114, 460–465, 758, 438/763, 3, 106, 112, 612–618, 121, 124–127, 438/598, 684–688, 928, 401, 975, 68, 458, 438/759, FOR. 386, FOR. 387; 257/659, 257/660, E43.001, E27.001, E27.005, E27.008, 257/E23.001, E23.114, E23.116, E23.142, 257/E23.144, 797, E23.179, E21.599, E21.602–E21.607, 257/E21.703, E23.151, E23.153
See application file for complete search history.

(56) References Cited

U.S. PATENT DOCUMENTS 6,365,438 B1 *  4/2002 Ishida et al. ............... 438/118
6,838,748 B2 *  1/2005 Ishio et al. ................ 257/659
6,869,861 B1 *  3/2005 Glenn et al. ............... 438/462
6,885,101 B2 *  4/2005 Storli ........................ 257/737
7,294,910 B2 * 11/2007 Thomas et al. ............. 257/659
7,332,415 B2 *  2/2008 Nagai et al. ............... 438/463
7,374,971 B2 *  5/2008 Yuan et al. ................ 438/113
7,556,985 B2 *  7/2009 Fukasawa et al. ......... 438/113
2001/0035401 A1 * 11/2001 Manor .................... 219/121.72
2002/0064935 A1 *  5/2002 Honda ....................... 438/622
2002/0158345 A1 * 10/2002 Hedler et al. .............. 257/786
2003/0062965 A1 *  4/2003 Jensen ........................ 333/12
2003/0104679 A1 *  6/2003 Dias et al. .................. 438/462
2003/0211656 A1 * 11/2003 Uchida ...................... 438/121
2003/0216010 A1 * 11/2003 Atlas ......................... 438/462
2004/0119095 A1 *  6/2004 Tuttle et al. ................ 257/200
2004/0150091 A1 *  8/2004 Stobbs ...................... 257/687
2004/0232536 A1 * 11/2004 Fukuzumi .................. 257/684
2004/0259332 A1 * 12/2004 Fukuoka et al. ........... 438/464

(Continued)

FOREIGN PATENT DOCUMENTS

JP            55078518 A   *  6/1980

(Continued)

*Primary Examiner*—Matthew C Landau
*Assistant Examiner*—Joseph C Nicely
(74) *Attorney, Agent, or Firm*—Kubotera & Associates, LLC

(57) ABSTRACT

A semiconductor device of a wafer level chip size package type is formed by cutting a semiconductor wafer with a plurality of semiconductor elements formed thereon in pieces. The semiconductor device includes a semiconductor substrate as the semiconductor wafer having a magnetic layer formed on at least one of a front surface and a backside surface of the semiconductor wafer.

5 Claims, 12 Drawing Sheets

U.S. PATENT DOCUMENTS

| | | | |
|---|---|---|---|
| 2005/0054179 A1* | 3/2005 | Nagai | 438/460 |
| 2005/0176174 A1* | 8/2005 | Leedy | 438/107 |
| 2005/0199995 A1* | 9/2005 | Nomoto et al. | 257/692 |
| 2006/0012020 A1* | 1/2006 | Gilleo | 257/678 |
| 2006/0289970 A1* | 12/2006 | Gogl et al. | 257/659 |
| 2008/0061407 A1* | 3/2008 | Yang et al. | 257/660 |
| 2008/0067323 A1* | 3/2008 | Halahmi et al. | 250/207 |
| 2008/0105662 A1* | 5/2008 | Shigematsu et al. | 219/121.67 |
| 2008/0302559 A1* | 12/2008 | Leedy | 174/254 |

FOREIGN PATENT DOCUMENTS

| | | |
|---|---|---|
| JP | 2002-016167 | 1/2002 |
| WO | WO 2004001827 * | 12/2003 |
| WO | WO 2004/004006 A1 * | 1/2004 |

* cited by examiner

METHOD OF PRODUCING A SEMICONDUCTOR DEVICE HAVING A MAGNETIC LAYER FORMED THEREON

BACKGROUND OF THE INVENTION AND RELATED ART STATEMENT

1. Field of the Invention

The present invention relates to a method of producing a semiconductor device of a wafer level chip size package type, in which a semiconductor wafer with a plurality of semiconductor elements formed thereon is cut in pieces to obtain the semiconductor device.

2. Description of Related Art

An electric device has been developed to have various functionalities processed at a higher speed in a smaller size. With this trend, it has been required to mount electrical elements on a conductive pattern substrate with a higher density. As a result of the high density, radio interference has become an issue between pins of a semiconductor device or relative to a peripheral device and other semiconductor device.

The radio interference is mainly caused by a radiation noise generated from an active circuit of a semiconductor element. The radiation noise is generated from a conductive pattern on a mount substrate or a surface of a semiconductor device such as a front surface, a rear surface, or a side surface, thereby causing the radio interference such as radio disturbance and abnormal resonance.

In order to reduce the radio interference, a conventional semiconductor device is provided with a cap formed of a radio wave suppression member having a conductive layer in a front surface or inside for covering the semiconductor device (refers to Patent Reference 1).

Patent Reference 1: Japanese Patent Publication (Kokai) No. 2002-16167

In the conventional semiconductor device, the cap formed of the radio wave suppression member is attached to the semiconductor device after the semiconductor device is produced. Accordingly, it is necessary to attach the cap in an additional step after the semiconductor device is produced, thereby increasing production time and lowering production efficiency of the semiconductor device. Further, when the semiconductor device is provided with the radio wave suppression function after the semiconductor device is produced, the semiconductor device has a size larger than that of a semiconductor element (chip size). Accordingly, it is difficult to reduce a chip size to meet the requirement for the high density mounting.

In view of the problems described above, an object of the present invention is to provide a semiconductor device with the radio wave suppression function having a size substantially same as a chip size. Another object of the present invention is to provide a method of efficiently producing the semiconductor device.

Further objects and advantages of the invention will be apparent from the following description of the invention.

SUMMARY OF THE INVENTION

In order to attain the objects described above, according to the present invention, a semiconductor device of a wafer level chip size package type is formed by cutting a semiconductor wafer with a plurality of semiconductor elements formed thereon in pieces. The semiconductor device includes a semiconductor substrate as the semiconductor wafer having a magnetic layer on at least one of a front surface and a backside surface thereof.

According to the present invention, a method of producing a semiconductor device by cutting a semiconductor wafer with a plurality of semiconductor elements formed thereon in pieces includes a step of forming a magnetic layer on at least one of a front surface and a backside surface of the semiconductor wafer and a step of cutting the semiconductor wafer with the magnetic layer in pieces.

In the present invention, the semiconductor is produced with the semiconductor wafer as a single piece in a series of manufacturing steps. Accordingly, it is possible to produce a large number of the semiconductors with radio wave suppression function at a time, thereby reducing production time and improving production efficiency. Further, it is possible to produce the semiconductor device having a size substantially same as a chip size. Accordingly, it is possible to produce a high density conductive pattern substrate with the radio wave suppression function, thereby reducing a size of an electric device.

DETAILED DESCRIPTION OF PREFERRED EMBODIMENTS

Hereunder, embodiments of the present invention will be explained with reference to the accompanying drawings.

First Embodiment

Figure 1:
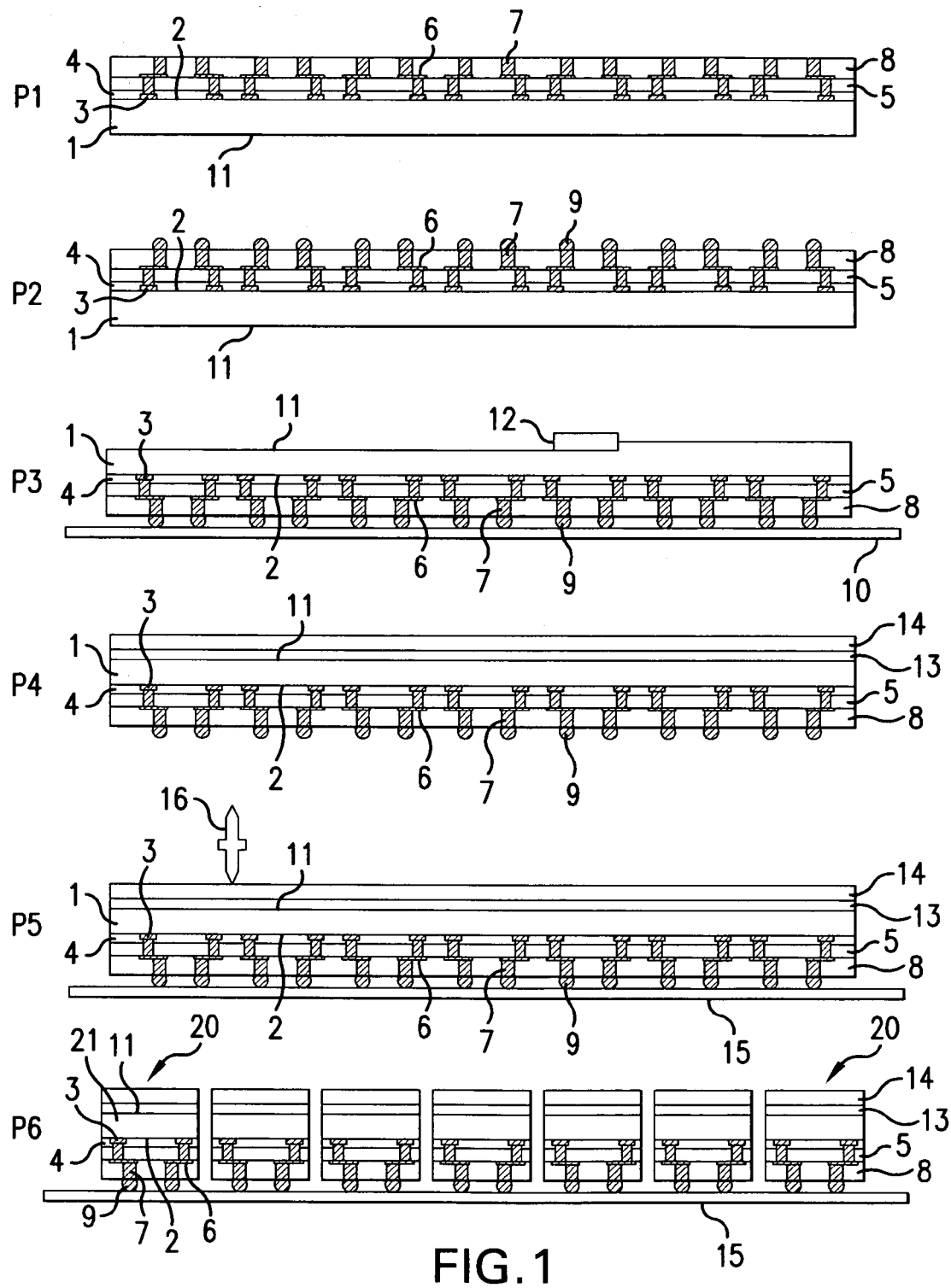
FIG. 1 is a view showing a method of producing a semiconductor device according to a first embodiment of the present invention.
Figure 2:
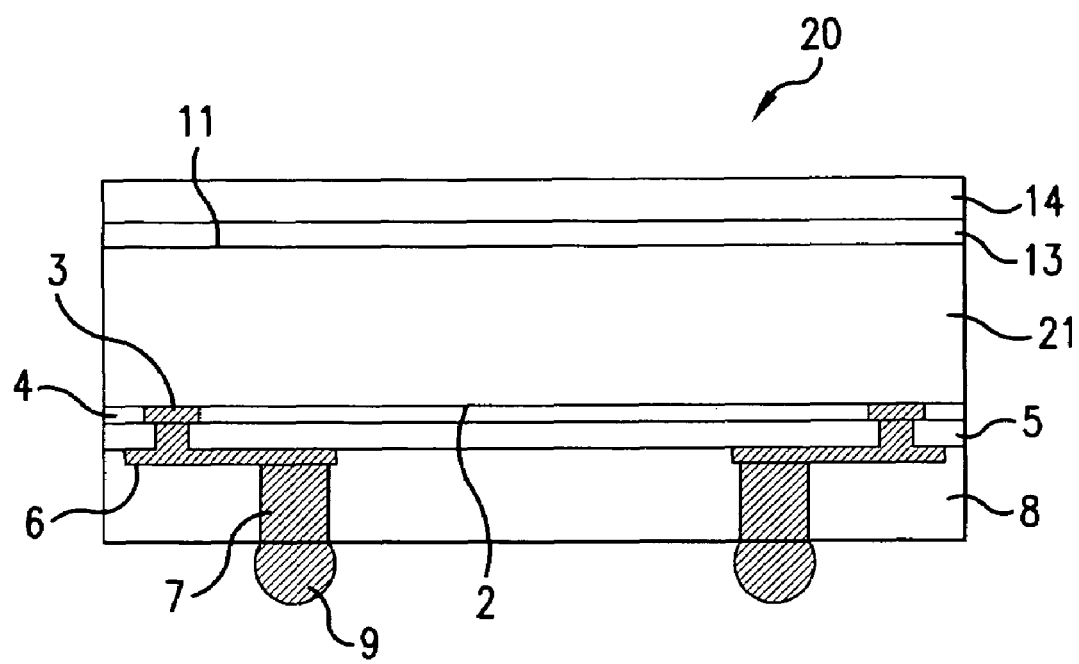
FIG. 2 is a schematic diagram showing the semiconductor device according to the first embodiment of the present invention.

FIG. 1 is a view showing a method of producing a semiconductor device according to a first embodiment of the present invention. FIG. 2 is a schematic diagram showing the semiconductor device according to the first embodiment of the present invention. In the embodiment, the semiconductor device is a wafer level chip size package type, and a semiconductor wafer 1 formed of silicon and the like is used. The semiconductor wafer 1 is provided with a plurality of semiconductor elements such as LSIs formed thereon in advance. On a front surface 2 of the semiconductor substrate 1, there are provided in advance electrodes 3 formed of an aluminum alloy for connecting the semiconductor elements and a protective layer 4 formed of silicon oxide or silicon nitride for protecting active circuits of the semiconductor elements. Holes are formed in the protective layer 4 at locations of the electrodes 3 for connecting re-wirings 6 in a later step (described later).

The front surface 2 of the semiconductor wafer 1 is provided with cutting lines, so that the semiconductor wafer 1 is cut along the cutting lines vertically and horizontally into pieces in a later step (described later). A method of producing the semiconductor device will be explained next as indicated by P1 to P6 in FIG. 1.

In P1, an insulating layer 5 is formed on the front surface 2 of the semiconductor wafer 1 outside the protective layer 4 with lithography. A copper layer is formed outside the insulating layer 5 with plating, and the copper layer is etched to form conductive patterns (re-wirings 6). After another plating step, posts 7 are formed at specific locations on the re-wirings 6 with etching, and an encapsulation resin 8 such as an epoxy resin is poured to seal the re-wirings 6 and the posts 7. After curing the epoxy resin, an outside surface of the encapsulation resin 8 is ground to expose the posts 7 on the surface.

In P2, after the posts 7 on the surface of the encapsulation resin 8 are exposed, solder terminals 9 are formed on the posts 7 with screen printing or by adhering solder balls. In P3, the semiconductor wafer 1 with the solder terminals 9 is turned over, so that a grind tape 10 is attached to a surface of the semiconductor wafer 1 with the solder terminals 9. A backside surface 11 of the semiconductor wafer 1 is ground down to a specific thickness with a grind stone 12.

In P4, after the grinding, the semiconductor wafer 1 is detached from the grind tape 10. A ferrite plate with a size same as that of the backside surface 11 and a specific thickness such as 0.05 to 0.5 mm is attached to the backside surface 11 of the semiconductor wafer 1 with an adhesive 13 such as an epoxy type resin to form a magnetic layer 14 formed of ferrite.

In P5, after the magnetic layer 14 is formed on the semiconductor wafer 1, a separation tape 15 is attached to the surface of the semiconductor wafer 1 with the solder terminals 9. While a far-infrared ray passes through the semiconductor wafer 1, the semiconductor wafer 1 is cut with a cutting blade 16 in vertical and lateral directions along cutting lines drawn in advance on a front surface 2 of the semiconductor wafer 1, thereby obtaining a plurality of pieces.

In P6, a semiconductor substrate 21, i.e., a single piece cut from the semiconductor wafer 1, is provided with the components described above to from a semiconductor device 20 of a wafer level chip size package type. The semiconductor devices 20 gradually move apart from each other due to elasticity of the separation tape 15. A robot arm is inserted into a gap between the semiconductor devices 20 to grab the same, and transfers the semiconductor devices 20 to a chip tray or an emboss tape.

FIG. 2 is a schematic diagram showing the semiconductor device 20 of a wafer level chip size package type produced through the process described above. In the semiconductor device 20, the electrodes 3 and the protective layer 4 are formed on the front surface 2 of the semiconductor substrate 21, i.e., the semiconductor wafer 1. The insulating layer 5, the re-wirings 6 electrically connected to the electrodes 3, and the posts 7 electrically connected between the re-wirings 6 and the solder terminals 9 are disposed outside the protective layer 4 and embedded in the encapsulation resin 8.

The magnetic layer 14 formed of ferrite is attached to the backside surface 11 of the semiconductor substrate 21 with the adhesive 13. The semiconductor devices 20 have a size same as that of the semiconductor elements formed on the semiconductor wafer 1, i.e., a chip size. The magnetic layer 14 formed of ferrite is attached to the backside surface 11 of the semiconductor substrate 21 for absorbing radio wave from an active circuit of the semiconductor element to convert the radio wave to heat. Accordingly, it is possible to achieve high density mounting, and to provide the semiconductor device with radio wave suppression function for suppressing an influence of the radio wave from the active circuit of the semiconductor element.

After the ferrite plate is attached to the backside surface 11 of the semiconductor wafer 1 to form the magnetic layer 14, the semiconductor wafer 1 is cut into the pieces. Accordingly, it is possible to provide the semiconductor device with the radio wave suppression function in a series of the production steps. Accordingly, it is possible to produce a large number of the semiconductors with radio wave suppression function at a time, thereby reducing production time and improving production efficiency. Further, it is possible to produce the semiconductor device having a size substantially same as a chip size. Accordingly, it is possible to produce a high density conductive pattern substrate with the radio wave suppression function, thereby reducing a size of an electric device.

Second Embodiment

Figure 3:
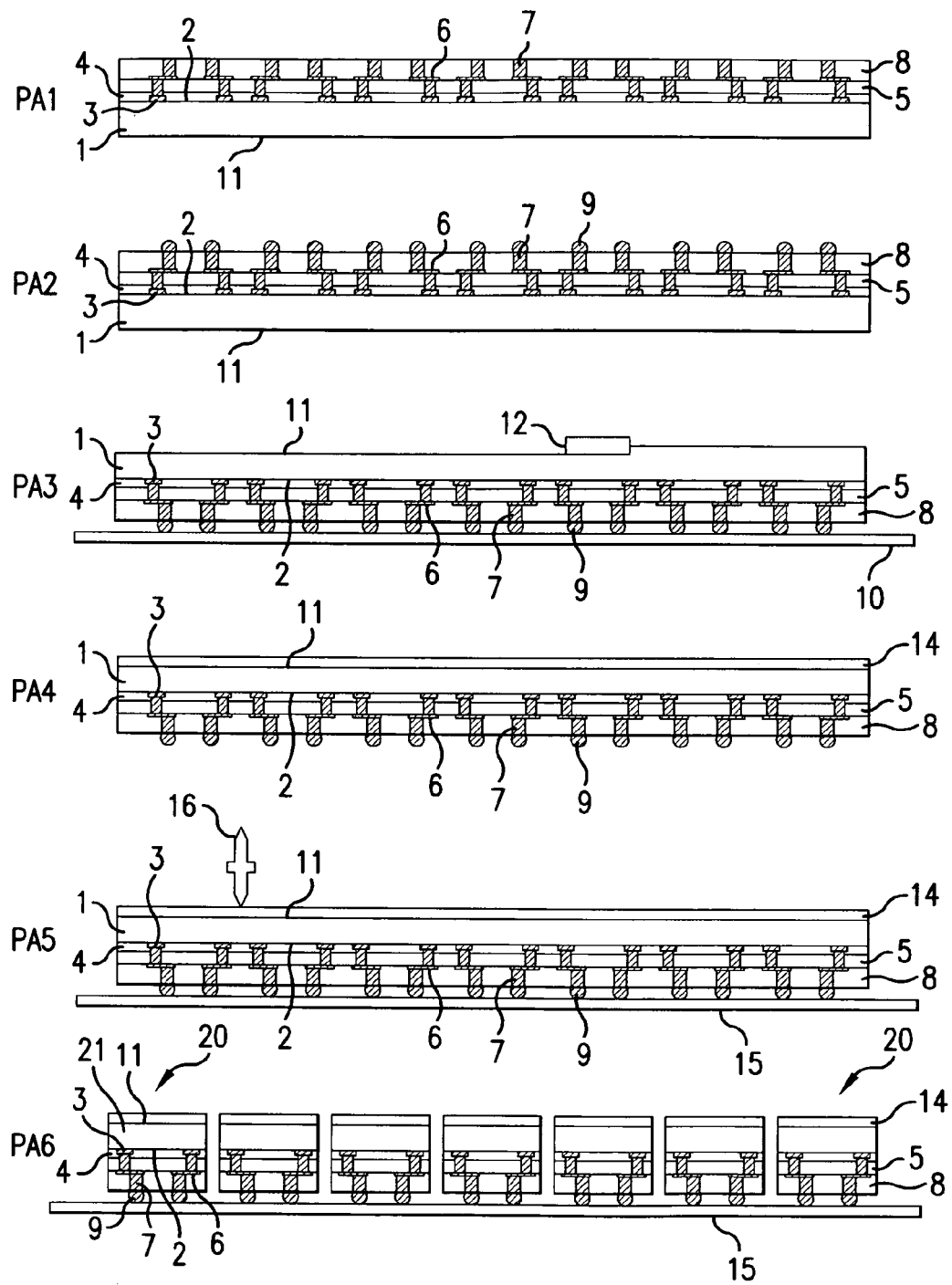
FIG. 3 is a view showing a method of producing a semiconductor device according to a second embodiment of the present invention.
Figure 4:
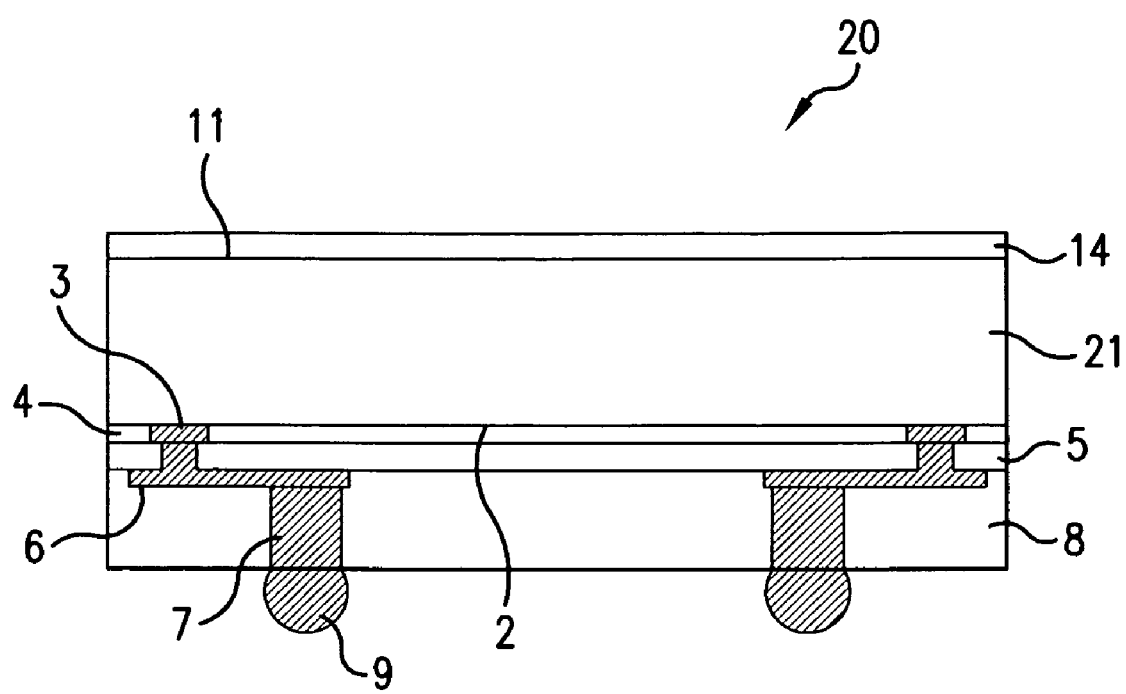
FIG. 4 is a schematic diagram showing the semiconductor device according to the second embodiment of the present invention.

FIG. 3 is a view showing a method of producing a semiconductor device according to a second embodiment of the present invention. FIG. 4 is a schematic diagram showing the semiconductor device according to the second embodiment of the present invention. In the second embodiment, components same as those in the first embodiment are designated by the same reference numerals, and explanations thereof are omitted. The semiconductor device is a wafer level chip size package type, and the semiconductor wafer 1 same as that in the first embodiment is used.

A method of producing the semiconductor device will be explained next as indicated by PA1 to PA6 in FIG. 3. PA1 to PA3 are same as P1 to P3 in the first embodiment, and explanations thereof are omitted. In PA4, after the grinding, the semiconductor wafer 1 is detached from the grind tape 10. A ferrite layer with a specific thickness such as 1 to 5 μm is formed entirely on the backside surface 11 of the semiconductor wafer 1 with chemical plating such as electroless plating to form the magnetic layer 14. PA5 to PA6 are same as P5 to P6 in the first embodiment, and explanations thereof are omitted.

FIG. 4 is a schematic diagram showing the semiconductor device 20 of a wafer level chip size package type produced through the process described above. In the semiconductor device 20, the electrodes 3 and the protective layer 4 are formed on the front surface 2 of the semiconductor substrate 21, i.e., the semiconductor wafer 1. The insulating layer 5, the re-wirings 6 electrically connected to the electrodes 3, and the posts 7 electrically connected between the re-wirings 6 and the solder terminals 9 are disposed outside the protective layer 4 and embedded in the encapsulation resin 8.

The magnetic layer 14, i.e., the ferrite layer formed with chemical plating, is formed on the backside surface 11 of the semiconductor substrate 21. The semiconductor devices 20 have a size same as that of the semiconductor elements formed on the semiconductor wafer 1, i.e., a chip size. The magnetic layer 14 is formed on the backside surface 11 of the semiconductor substrate 21 for absorbing radio wave from an active circuit of the semiconductor element to convert the radio wave to heat. Accordingly, it is possible to achieve high density mounting, and to provide the semiconductor device with radio wave suppression function for suppressing an influence of the radio wave from the active circuit of the semiconductor element.

After the ferrite layer is formed on the backside surface 11 of the semiconductor wafer 1 with chemical plating, the semiconductor wafer 1 is cut into the pieces. Accordingly, it is possible to provide the semiconductor device with the radio wave suppression function in a series of the production steps. As described above, the ferrite layer is formed on the backside surface 11 of the semiconductor wafer 1 with chemical plating to form the magnetic layer in a series of the production steps. The semiconductor wafer is cut into the pieces to form the semiconductor devices. Accordingly, in addition to the advantages of the first embodiment, it is possible to reduce the thickness of the magnetic layer thin, thereby reducing a thickness of the semiconductor device.

Third Embodiment

Figure 5:
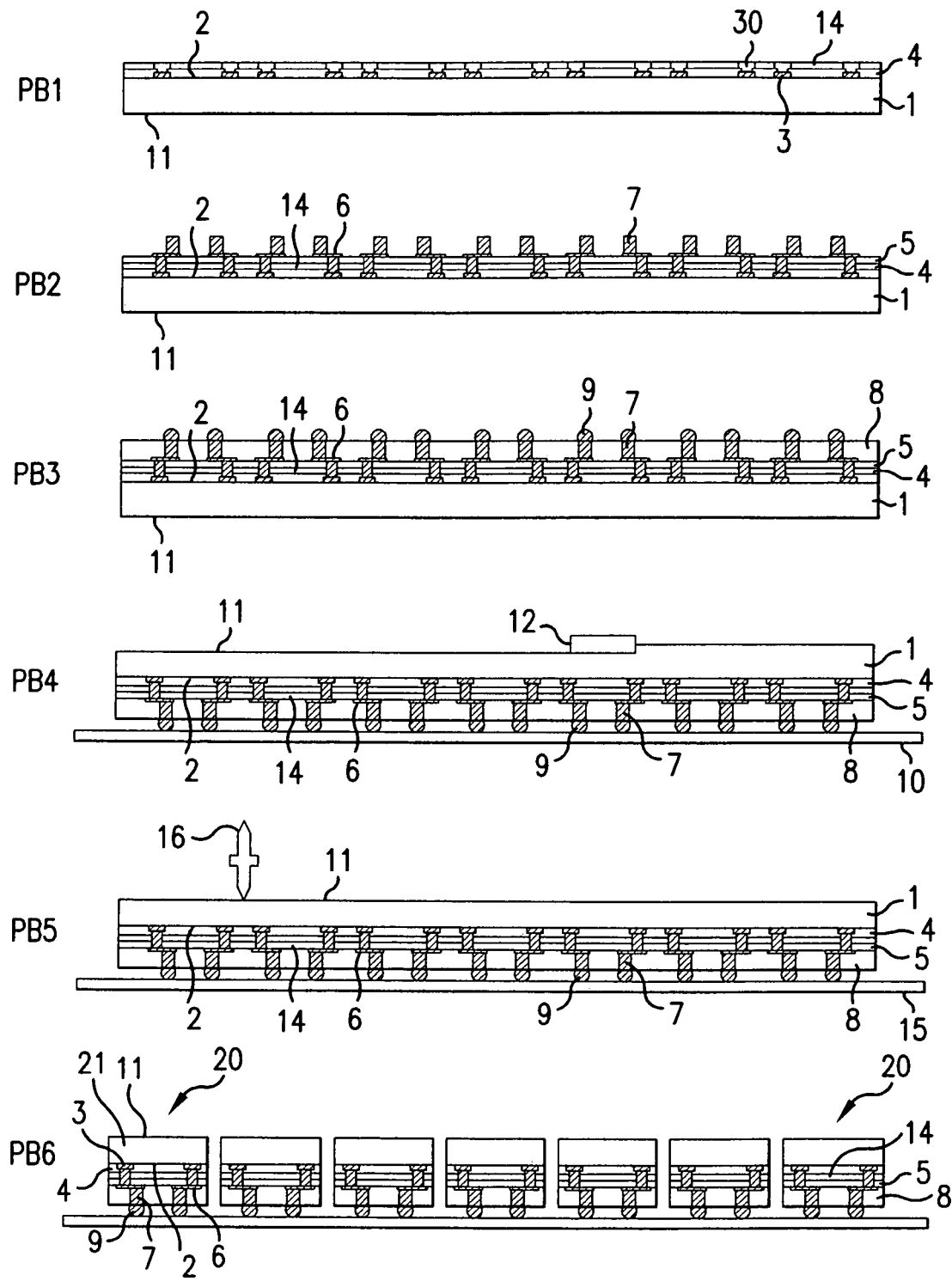
FIG. 5 is a view showing a method of producing a semiconductor device according to a third embodiment of the present invention.
Figure 6:
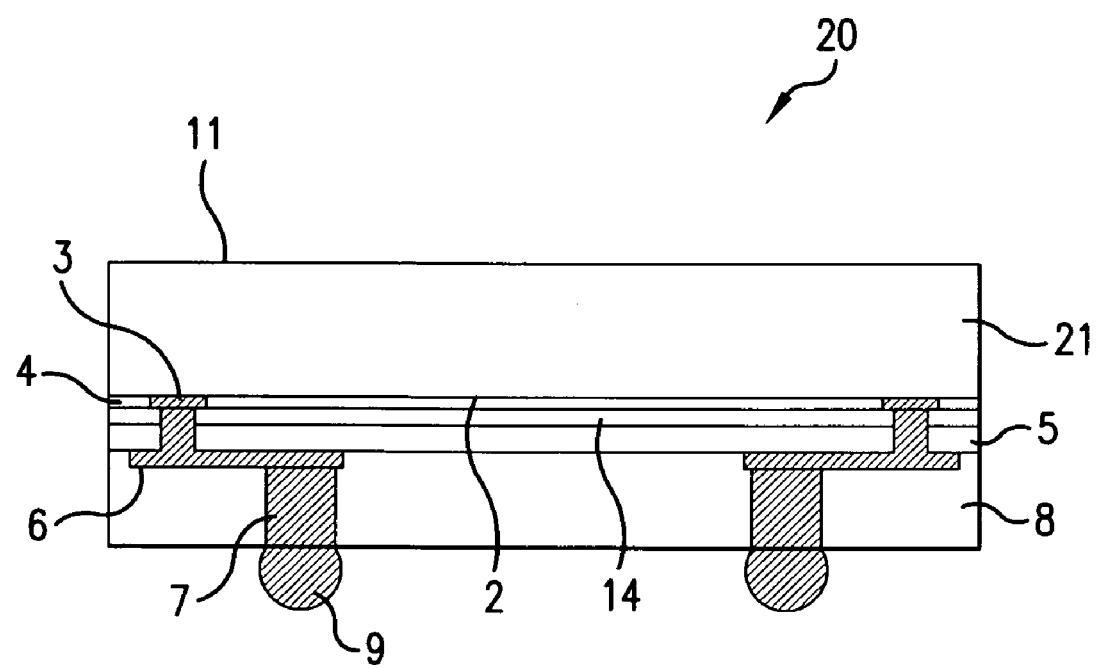
FIG. 6 is a schematic diagram showing the semiconductor device according to the third embodiment of the present invention.

FIG. 5 is a view showing a method of producing a semiconductor device according to a third embodiment of the present invention. FIG. 6 is a schematic diagram showing the semiconductor device according to the third embodiment of the present invention. In the third embodiment, components same as those in the first embodiment are designated by the same reference numerals, and explanations thereof are omitted. The semiconductor device is a wafer level chip size package type, and the semiconductor wafer 1 same as that in the first embodiment is used.

A method of producing the semiconductor device will be explained next as indicated by PB1 to PB6 in FIG. 5. In PB1, the electrodes 3 electrically connected to the active circuits of the semiconductor elements are formed on the front surface 2 of the semiconductor wafer 1 in advance, and a resist layer 30 covers the electrodes 3. Then, a ferrite layer is formed entirely on the front surface 2 of the semiconductor wafer 1 with chemical plating to form the magnetic layer 14.

In PB2, the resist layer 30 on the electrodes 3 is removed to selectively form the magnetic layers 14 on the protective layers 4 of the active circuits of the semiconductor elements. Then, similar to P1 in the first embodiment, the insulating layer 5 is formed outside the protective layers 4, and the posts 7 and the re-wirings 6 are formed outside the protective layers 4.

In PB3, similar to P1 in the first embodiment, the encapsulation resin 8 seals the re-wirings 6 and the posts 7. After curing, the posts 7 are exposed on the ground surface of the encapsulation resin 8. Then, similar to P2 in the first embodiment, the solder terminals 9 are formed on the posts 7.

In PB4, similar to P2 in the first embodiment, the backside surface 11 of the semiconductor wafer 1 is ground down to a specific thickness. In PB5, after the grinding, the semiconductor wafer 1 is detached from the grind tape 10. Then, similar to P5 in the first embodiment, after the magnetic layer 14 is formed on the semiconductor wafer 1, the semiconductor wafer 1 is cut with the cutting blade 16 into a plurality of pieces. PB6 is the same as P6 in the first embodiment, and explanation thereof is omitted.

FIG. 6 is a schematic diagram showing the semiconductor device 20 of a wafer level chip size package type produced through the process described above. In the semiconductor device 20, the electrodes 3 and the protective layers 4 are formed on the front surface 2 of the semiconductor substrate 21. The magnetic layers 14 are selectively formed with chemical plating on the protective layers 4 of the active circuits of the semiconductor elements. The insulating layer 5, the re-wirings 6 electrically connected to the electrodes 3, and the posts 7 electrically connected between the re-wirings 6 and the solder terminals 9 are disposed outside the magnetic layers 14 and embedded in the encapsulation resin 8.

The backside surface 11 of the semiconductor substrate 21 is ground in PB4. The semiconductor devices 20 have a chip size similar to the first embodiment. The magnetic layers 14 are formed on the protective layers 4 of the active circuits of the semiconductor elements on the front surface 2 of the semiconductor substrate 21 for absorbing radio wave from the active circuits of the semiconductor elements to convert the radio wave to heat. Accordingly, it is possible to achieve high density mounting, and to produce the semiconductor device with the radio wave suppression function.

After the magnetic layers 14 are selectively formed on the protective layers 4 of the active circuits of the semiconductor elements on the front surface 2 of the semiconductor substrate 21 with chemical plating, the semiconductor wafer 1 is cut into the pieces. Accordingly, it is possible to provide the semiconductor device with the radio wave suppression function in a series of the production steps. Further, it is possible to produce a large number of the semiconductors with the radio wave suppression function at a time.

As described above, the magnetic layers are selectively formed on the protective layers of the active circuits of the semiconductor elements with chemical plating in a series of the production steps. The semiconductor wafer is cut into the pieces to form the semiconductor devices. Accordingly, in addition to the advantages of the second embodiment, it is possible to arrange the magnetic layers just below the active circuits, thereby effectively suppressing the radio wave from the active circuits of the semiconductor elements.

Fourth Embodiment

Figure 7:
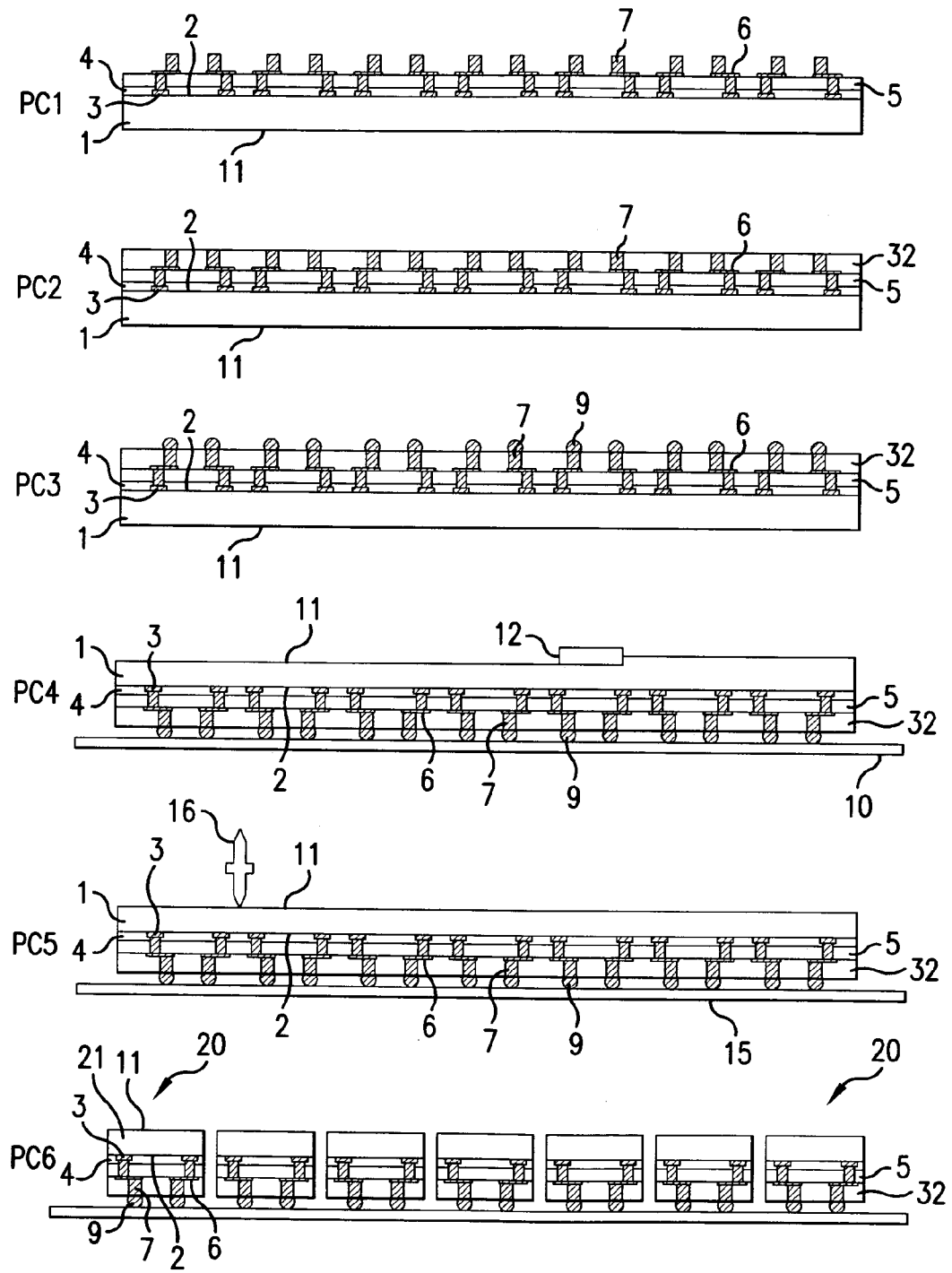
FIG. 7 is a view showing a method of producing a semiconductor device according to a fourth embodiment of the present invention.
Figure 8:
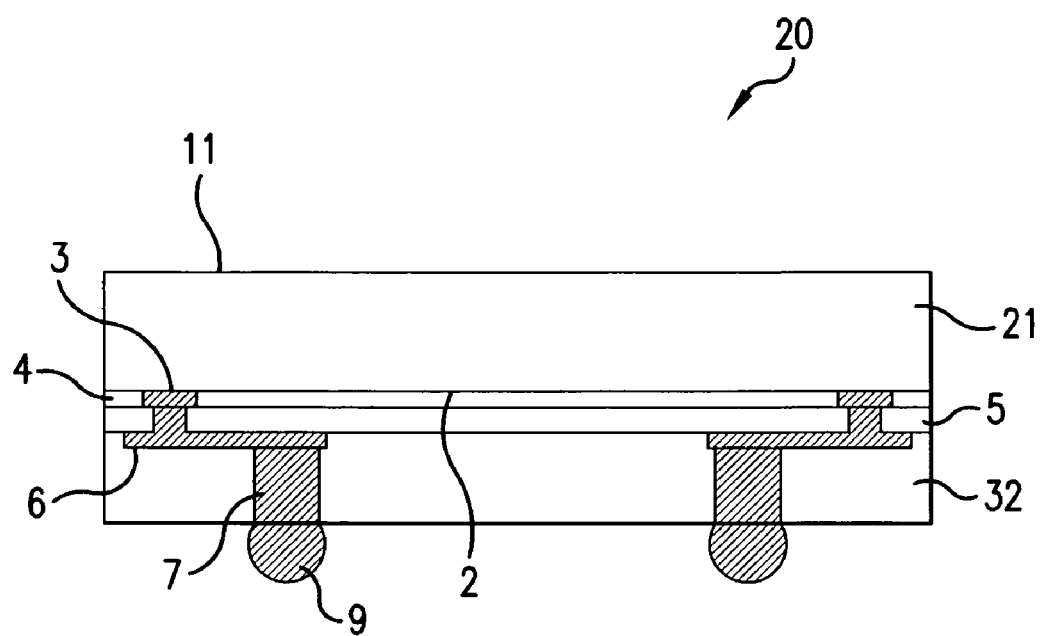
FIG. 8 is a schematic diagram showing the semiconductor device according to the fourth embodiment of the present invention.

FIG. 7 is a view showing a method of producing a semiconductor device according to a fourth embodiment of the present invention. FIG. 8 is a schematic diagram showing the semiconductor device according to the fourth embodiment of the present invention. In the fourth embodiment, components same as those in the first embodiment are designated by the same reference numerals, and explanations thereof are omitted. The semiconductor device is a wafer level chip size package type, and the semiconductor wafer 1 same as that in the first embodiment is used.

A method of producing the semiconductor device will be explained next as indicated by PC1 to PC6 in FIG. 7. In PC1, similar to P1 in the first embodiment, the insulating layer 5, the re-wirings 6, and the posts 7 are formed on the front surface 2 of the semiconductor wafer 1 prepared in advance.

In PC2, an encapsulation resin (electromagnetic shield resin 32) containing a magnetic material such as metal powder and ferrite at a specific ratio such as 20 to 70 wt. % is poured to seal the re-wirings 6 and the posts 7. After curing, an outer surface of the electromagnetic shield resin 32 is ground to expose the posts 7 on the ground surface of the electromagnetic shield resin 32. In PC3, after the posts 7 are exposed on the ground surface of the electromagnetic shield resin 32, similar to P2 in the first embodiment, the solder terminals 9 are formed on the posts 7.

In PC4, similar to P2 in the first embodiment, the backside surface 11 of the semiconductor wafer 1 is ground down to a specific thickness. In PC5, after the grinding, the semiconductor wafer 1 is detached from the grind tape 10. Then, similar to P5 in the first embodiment, after the electromagnetic shield resin 32 seals, the semiconductor wafer 1 is cut with the cutting blade 16 into a plurality of pieces. PB6 is the same as P6 in the first embodiment, and explanation thereof is omitted.

FIG. 8 is a schematic diagram showing the semiconductor device 20 of a wafer level chip size package type produced through the process described above. In the semiconductor device 20, the electrodes 3 and the protective layers 4 are formed on the front surface 2 of the semiconductor substrate 21. The insulating layer 5, the re-wirings 6 electrically connected to the electrodes 3, and the posts 7 electrically connected between the re-wirings 6 and the solder terminals 9 are disposed outside the protective layers 4 and sealed with the electromagnetic shield resin 32.

The backside surface 11 of the semiconductor substrate 21 is ground in PC4. The semiconductor devices 20 have a chip size similar to the first embodiment. The electromagnetic shield resin 32 seals the re-wirings 6 and the posts 7 on the front surface 2 of the semiconductor substrate 21 for absorbing radio wave from the active circuits of the semiconductor elements to convert the radio wave to heat. Accordingly, it is possible to achieve high density mounting, and to produce the semiconductor device with the radio wave suppression function.

After the electromagnetic shield resin 32 seals the re-wirings 6 and the posts 7 on the front surface 2 of the semiconductor wafer 1, the semiconductor wafer 1 is cut into the pieces. Accordingly, it is possible to provide the semiconductor device with the radio wave suppression function in a series of the production steps. Further, it is possible to produce a large number of the semiconductors with the radio wave suppression function at a time.

As described above, the electromagnetic shield resin seals the re-wirings and the posts in a series of the production steps. The semiconductor wafer is cut into the pieces to form the semiconductor devices. Accordingly, in addition to the advantages of the second embodiment, it is possible to provide the radio wave suppression function without forming the magnetic layer, thereby reducing the thickness of the semiconductor device. Further, the electromagnetic shield resin is arranged just above the active circuits of the semiconductor elements, thereby effectively suppressing the radio wave from the active circuits of the semiconductor elements similar to the third embodiment.

Fifth Embodiment

Figure 9:
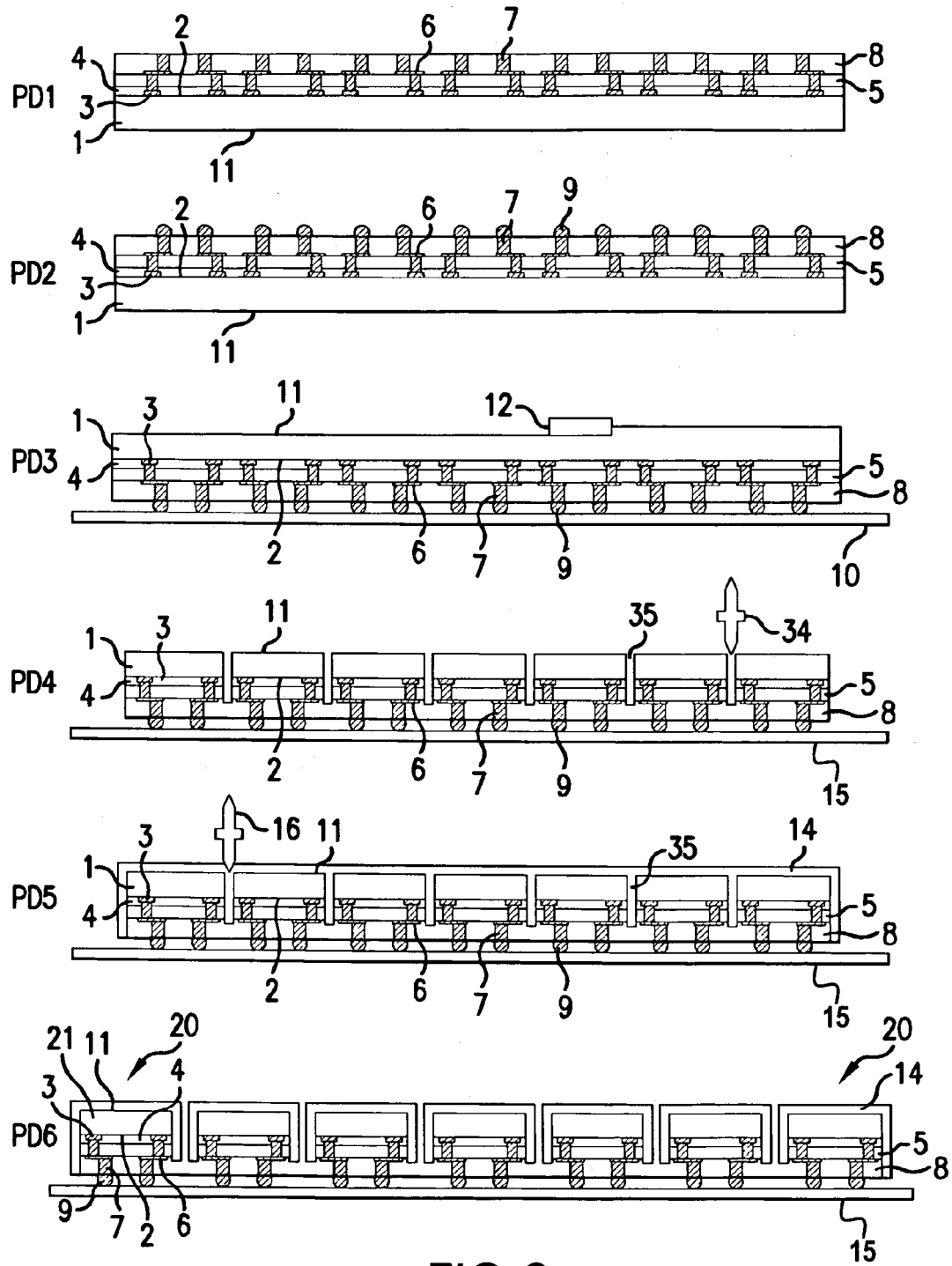
FIG. 9 is a view showing a method of producing a semiconductor device according to a fifth embodiment of the present invention.
Figure 10:
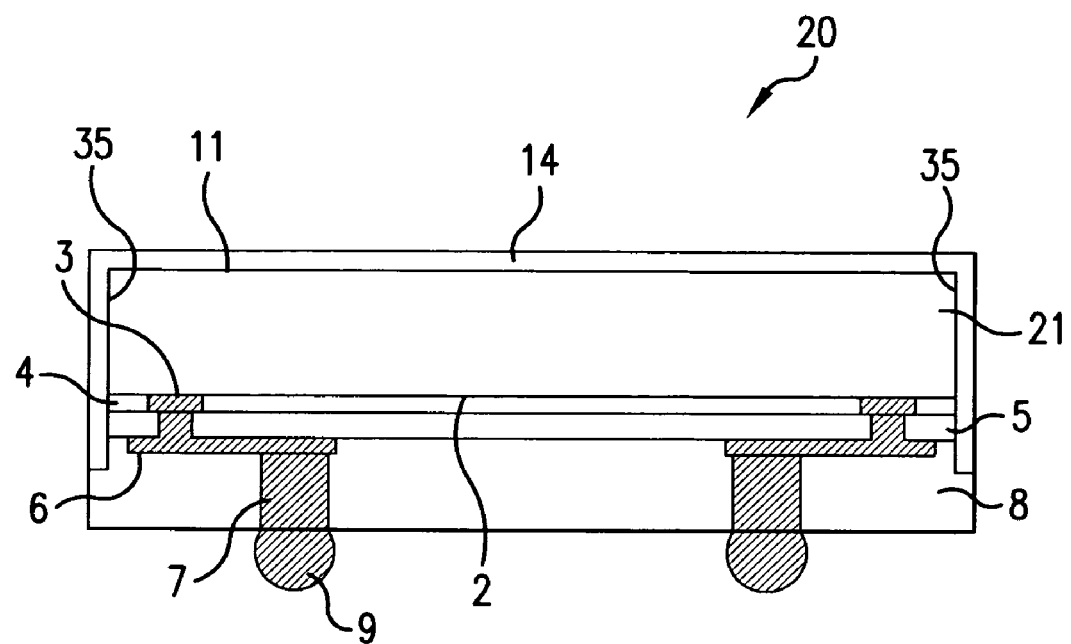
FIG. 10 is a schematic diagram showing the semiconductor device according to the fifth embodiment of the present invention.

FIG. 9 is a view showing a method of producing a semiconductor device according to a fifth embodiment of the present invention. FIG. 10 is a schematic diagram showing the semiconductor device according to the fifth embodiment of the present invention. In the fifth embodiment, components same as those in the first embodiment are designated by the same reference numerals, and explanations thereof are omitted. The semiconductor device is a wafer level chip size package type, and the semiconductor wafer 1 same as that in the first embodiment is used.

A method of producing the semiconductor device will be explained next as indicated by PD1 to PD6 in FIG. 9. PD1 to PD3 are same as P1 to P3 in the first embodiment, and explanations thereof are omitted. In PD4, after the grinding, the semiconductor wafer 1 is detached from the grind tape 10. Similar to P5 in the first embodiment, the separation tape 15 is attached to the semiconductor wafer 1. The backside surface 11 of the semiconductor wafer 1 is cut with a cutter 34 having a relatively wide width such as 50 to 100 μm into the layer of the re-wirings 6 along lateral and vertical cutting lines to form cut portions 35.

In PD5, after the cut portions 35 are formed, the separation tape 15 is temporarily detached from the semiconductor wafer 1. A ferrite layer with a specific thickness such as 1 to 10 μm is formed entirely on the backside surface 11 of the semiconductor wafer 1 and the cut portions 35 with chemical plating to form the magnetic layer 14. After the magnetic layer 14 is formed on the semiconductor wafer 1, the separation tape 15 is attached to the semiconductor wafer 1 again. The semiconductor wafer 1 is cut with the cutting blade 16 having a relatively thin width such as 25 to 30 μm along cutting lines at centers of the cut portions 35, thereby obtaining a plurality of pieces.

In PD5, the magnetic layer 14 is formed even in the cut portions 35. In the actual case, the magnetic layer 14 has a small thickness, and formed only along walls of the cut portions 35, so that the magnetic layer 14 has recess Portions corresponding to the cut portions 35. PD6 is same as P6 in the first embodiment, and explanations thereof are omitted.

FIG. 10 is a schematic diagram showing the semiconductor device 20 of a wafer level chip size package type produced through the process described above. In the semiconductor device 20, the electrodes 3 and the protective layer 4 are formed on the front surface 2 of the semiconductor substrate 21. The insulating layer 5, the re-wirings 6 electrically connected to the electrodes 3, and the posts 7 electrically connected between the re-wirings 6 and the solder terminals 9 are disposed outside the protective layer 4 and embedded in the encapsulation resin 8.

The magnetic layer 14, i.e., the ferrite layer formed with chemical plating, is formed on the backside surface 11 of the semiconductor substrate 21 and four sidewalls thereof. The semiconductor devices 20 have a chip size similar to the first embodiment. The magnetic layer 14 is formed on the backside surface 11 of the semiconductor substrate 21 and the four sidewalls thereof for absorbing radio wave from an active circuit of the semiconductor element to convert the radio wave to heat. Accordingly, it is possible to achieve high density mounting, and to provide the semiconductor device with radio wave suppression function for suppressing an influence of the radio wave from the active circuit of the semiconductor element.

After the magnetic layer 14 is formed on the backside surface 11 of the semiconductor wafer 1 and the cut portions 35 with chemical plating, the semiconductor wafer 1 is cut into the pieces. Accordingly, it is possible to provide the semiconductor device with the radio wave suppression function in a series of the production steps. Further, it is possible to produce a large number of the semiconductors with radio wave suppression function at a time.

As described above, the cut portions are formed in the backside surface of the semiconductor wafer up to the layer of the re-wirings. The ferrite layer is formed on the backside surface of the semiconductor wafer and the cut portions with chemical plating to form the magnetic layer, and the semiconductor wafer is cut into the pieces to form the semiconductor devices in a series of the production steps. Accordingly, in addition to the advantages of the second embodiment, it is possible to cover the backside surface and the sidewalls of the semiconductor substrate with the magnetic layer, thereby effectively suppressing the radio wave from the active circuits of the semiconductor elements.

Sixth Embodiment

Figure 11:
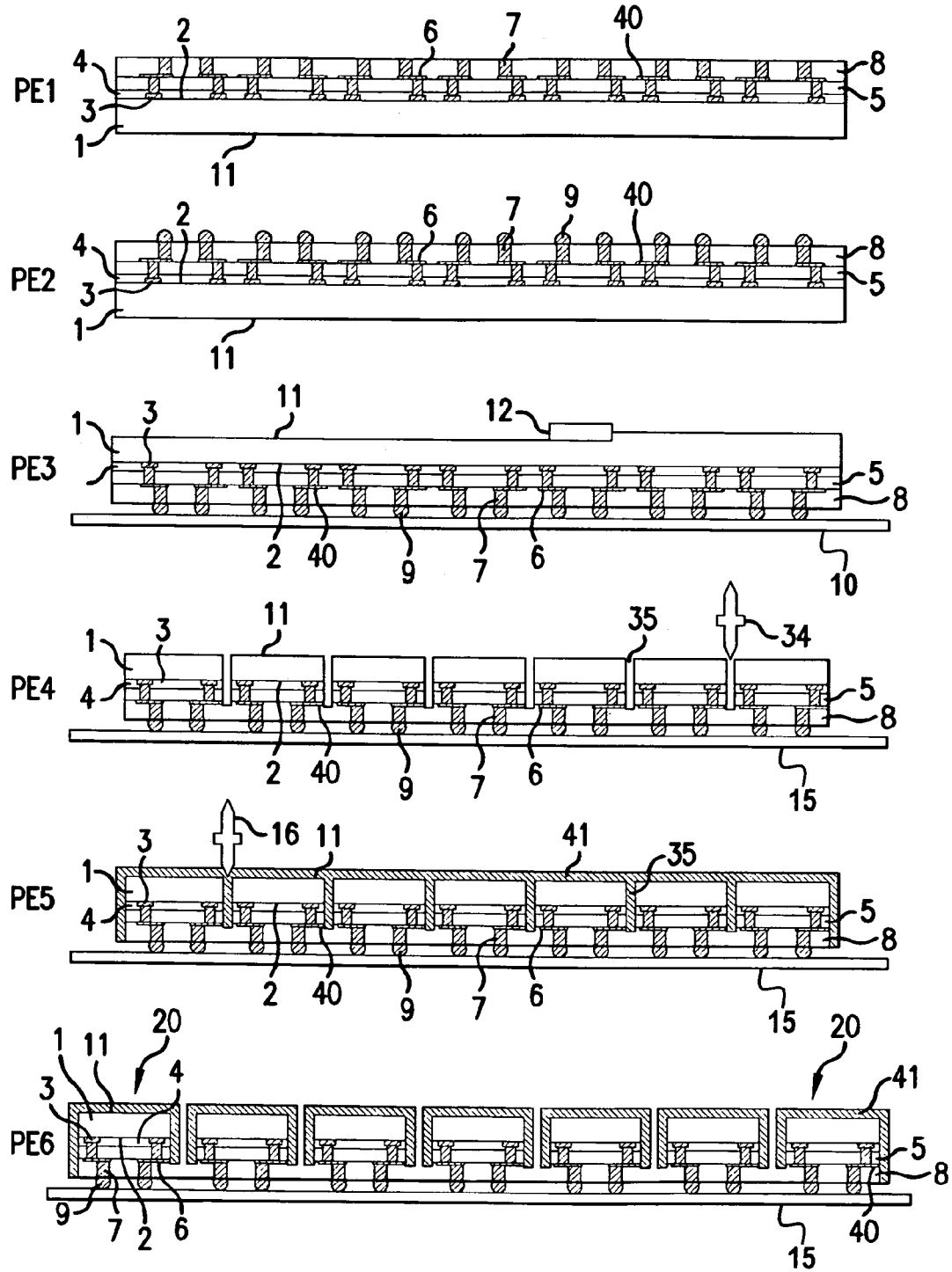
FIG. 11 is a view showing a method of producing a semiconductor device according to a sixth embodiment of the present invention.
Figure 12:
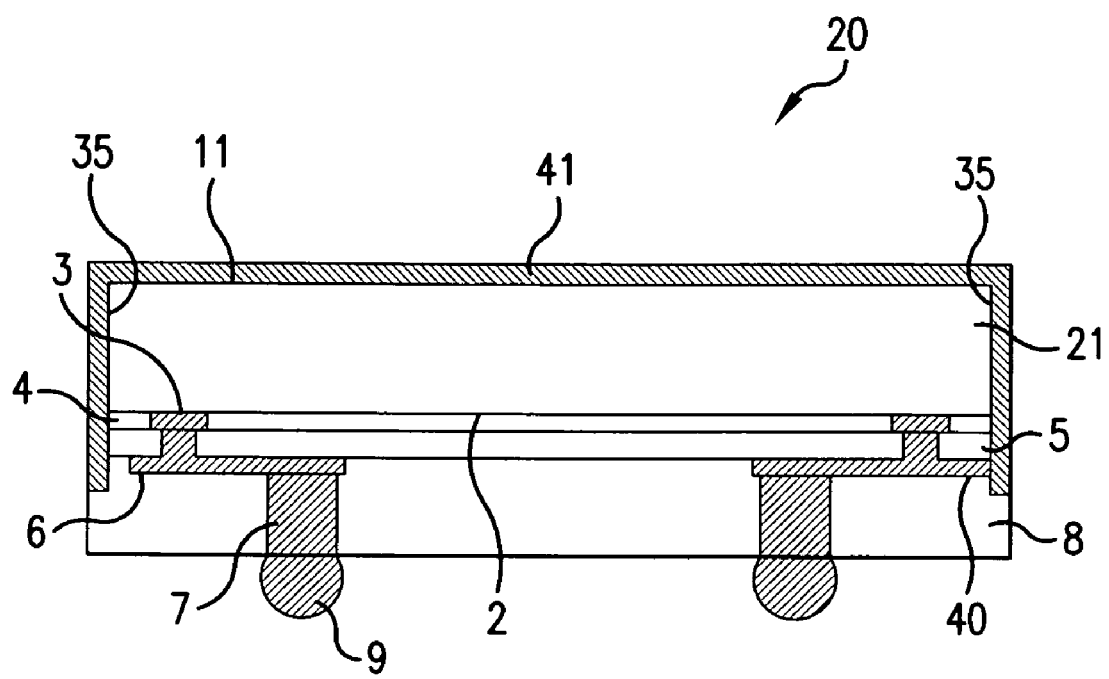
FIG. 12 is a schematic diagram showing the semiconductor device according to the sixth embodiment of the present invention.

FIG. 11 is a view showing a method of producing a semiconductor device according to a sixth embodiment of the present invention. FIG. 12 is a schematic diagram showing the semiconductor device according to the sixth embodiment of the present invention. In the sixth embodiment, components same as those in the fifth embodiment are designated by the same reference numerals, and explanations thereof are omitted. The semiconductor device is a wafer level chip size package type, and the semiconductor wafer 1 same as that in the first embodiment is used.

A method of producing the semiconductor device will be explained next as indicated by PE1 to PE6 in FIG. 11. In PE1, similar to P1 in the first embodiment, the insulating layer 5 is formed on the front surface 2 of the semiconductor wafer 1 prepared in advance. A copper layer is formed outside the insulating layer 5 with plating, and the re-wirings 6 are formed with etching. At this time, the re-wirings 6 to be connected to the solder terminals 9 as ground terminals are extended to the cutting lines to form extended portions 40. Then, similar to P1 in the first embodiment, the re-wirings 6 and the posts 7 are formed, and sealed by the encapsulation resin 8. After curing, the posts 7 are exposed on the ground surface of the encapsulation resin 8. PE2 and PE3 are the same as P2 and P3 in the first embodiment, and explanations thereof are omitted.

In PE4, the semiconductor wafer 1 is detached from the grind tape 10. Then, similar to PD4 in the fifth embodiment, the backside surface 11 of the semiconductor wafer 1 is cut with the cutter 34 having a relatively wide width into the extended portion 40 along lateral and vertical cutting lines to form the cut portions 35.

In PE5, after the cut portions 35 are formed, similar to PD5 in the fifth embodiment, a conductive metal layer 41 with a specific thickness such as 1 to 10 µm is formed entirely on the backside surface 11 of the semiconductor wafer 1 and the cut portions 35 with chemical plating. After the conductive metal layer 41 is formed on the semiconductor wafer 1, similar to PD5 in the fifth embodiment, the semiconductor wafer 1 is cut with the cutting blade 16 having a relatively thin width along the cutting lines at centers of the cut portions 35, thereby obtaining a plurality of pieces.

In PE5, the conductive metal layer 41 is formed even in the cut portions 35, similar to PD5 in the fifth embodiment. In the actual case, the conductive metal layer 41 has recess portions corresponding to the cut portions 35. PE6 is same as P6 in the first embodiment, and explanations thereof are omitted.

FIG. 12 is a schematic diagram showing the semiconductor device 20 of a wafer level chip size package type produced through the process described above. In the semiconductor device 20, the electrodes 3 and the protective layers 4 are formed on the front surface 2 of the semiconductor substrate 21. The insulating layer 5, the re-wirings 6 electrically connected to the electrodes 3, and the posts 7 electrically connected between the re-wirings 6 and the solder terminals 9 are disposed outside the protective layers 4 and embedded in the encapsulation resin 8.

The conductive metal layer 41 is formed on the backside surface 11 of the semiconductor substrate 21 and four sidewalls thereof, and is connected to ground through the extended portions 40. The semiconductor devices 20 have a chip size similar to the first embodiment. The conductive metal 41 is formed on the backside surface 11 of the semiconductor substrate 21 and the four sidewalls thereof for absorbing radio wave from an active circuit of the semiconductor element to convert the radio wave to heat. Accordingly, it is possible to achieve high density mounting, and to provide the semiconductor device with radio wave suppression function for suppressing an influence of the radio wave from the active circuit of the semiconductor element.

After the conductive metal layer 41 is formed on the backside surface 11 of the semiconductor wafer 1 and the cut portions 35 with chemical plating, the semiconductor wafer 1 is cut into the pieces. Accordingly, it is possible to provide the semiconductor device with the radio wave suppression function in a series of the production steps. Further, it is possible to produce a large number of the semiconductors with radio wave suppression function at a time.

As described above, the cut portions are formed in the backside surface of the semiconductor wafer up to the extended portions. The conductive metal layer is formed on the backside surface of the semiconductor wafer and the cut portions with chemical plating, and the semiconductor wafer is cut into the pieces to form the semiconductor devices in a series of the production steps. Accordingly, in addition to the advantages of the second embodiment, it is possible to cover the backside surface and the sidewalls of the semiconductor substrate with the conductive metal layer, thereby effectively suppressing the radio wave from the active circuits of the semiconductor elements.

In the embodiments, the metal layer forming process is performed with chemical plating, and the ferrite layer and the conductive metal layer may be formed with deposition. The magnetic layer may be replaced with the electromagnetic shield resin. In this case, the electromagnetic shield resin has a liquid form, and formed on the backside surface of the semiconductor wafer and the cut portions with screen printing. Further, the members having the radio wave suppression function may be combined, thereby further suppressing the radio wave from the active circuits of the semiconductor elements.

The disclosure of Japanese Patent Application No. 2004-236995, filed on Aug. 17, 2004, is incorporated in the application.

While the invention has been explained with reference to the specific embodiments of the invention, the explanation is illustrative and the invention is limited only by the appended claims.

What is claimed is:

1. A method of producing a semiconductor device, comprising the steps of:
   preparing a semiconductor wafer with a plurality of semiconductor elements formed thereon,
   forming a re-wiring electrically connected to at least one of the semiconductor elements on a front surface of the semiconductor wafer,
   forming a cut portion extending up to the re-wiring from a backside surface of the semiconductor wafer along a cutting line,
   forming a magnetic layer on the backside surface of the semiconductor wafer and the cut portion, and
   after forming the magnetic layer, cutting the semiconductor wafer into pieces from the backside surface of the semiconductor wafer along the cutting line to form the semiconductor device with a cutting blade.

2. A method of producing a semiconductor device according to claim 1, wherein said cutting blade has a thickness smaller than a width of the cut portion to form the semiconductor device.

3. A method of producing a semiconductor device according to claim 2, wherein, in the step of forming the magnetic layer, a ferrite layer is formed with a metal layer forming process.

4. A method of producing a semiconductor device according to claim 1, wherein, in the step of forming the magnetic layer, a ferrite layer is formed with a metal layer forming process.

5. A method of producing a semiconductor device according to claim 1, further comprising the steps of: after the step of preparing the semiconductor wafer, forming an extended portion to be electrically connected to a ground terminal by extending the re-wiring up to the cutting line, and forming a cut portion by cutting the semiconductor wafer from the backside surface thereof up to the extended portion along the cutting line, wherein the magnetic layer is formed on the backside surface of the semiconductor wafer and the cut portion with a metal layer forming process, and the semiconductor wafer is cut into pieces along the cutting line with the cutting blade having a thickness smaller than a width of the cut portion to form the semiconductor device.

* * * * *